(12) United States Patent
Chen

(10) Patent No.: US 8,956,901 B2
(45) Date of Patent: Feb. 17, 2015

(54) METHOD OF MANUFACTURING LED COMPONENT BY INTEGRATING EPITAXIAL STRUCTURE AND PACKAGE SUBSTRATE TOGETHER

(71) Applicant: Neobulb Technologies, Inc., Bandar Seri Begawan (BN)

(72) Inventor: Jen-Shyan Chen, Zhubei (TW)

(*) Notice: Subject to any disclaimer, the term of this patent is extended or adjusted under 35 U.S.C. 154(b) by 0 days.

(21) Appl. No.: 14/264,738

(22) Filed: Apr. 29, 2014

(65) Prior Publication Data

US 2014/0322839 A1 Oct. 30, 2014

Related U.S. Application Data

(62) Division of application No. 13/871,793, filed on Apr. 26, 2013.

(30) Foreign Application Priority Data

Apr. 10, 2013 (TW) .............................. 102112647 A

(51) Int. Cl.
H01L 21/00 (2006.01)
H01L 33/00 (2010.01)
H01L 33/60 (2010.01)

(52) U.S. Cl.
CPC .............. H01L 33/005 (2013.01); H01L 33/60 (2013.01)
USPC .................... 438/33; 438/28; 257/88; 257/99

(58) Field of Classification Search
CPC .. H01L 27/153; H01L 27/156; H01L 27/3204
USPC ................................... 438/33, 28; 257/88, 99
See application file for complete search history.

(56) References Cited

U.S. PATENT DOCUMENTS 8,686,430 B2 * 4/2014 Chen .............................. 257/76

* cited by examiner

*Primary Examiner* — Tu-Tu Ho
(74) *Attorney, Agent, or Firm* — Richard C. Vershave; Foster Pepper PLLC

(57) ABSTRACT

An integral LED component is mounted into a hollow carrier. The carrier has two conductive electrodes with opposite polarities. The LED component comprises a substrate, N number of LED epitaxial structures where N is a number greater than one, a third electrode and a fourth electrode. The N number of LED epitaxial structures are formed on the upper surface of the substrate, the at least one of the N number of LED epitaxial structures comprises a first and a second electrode. The third and fourth electrodes are formed on the upper surface and located outside the N number of LED epitaxial structures, the respective electrodes are electrically connected to form a circuit. The two conductive electrodes of the hollow carrier are used for electrically connecting the third and fourth electrodes of the substrate, and the lower surface of the substrate is exposed to the hollow carrier.

6 Claims, 11 Drawing Sheets

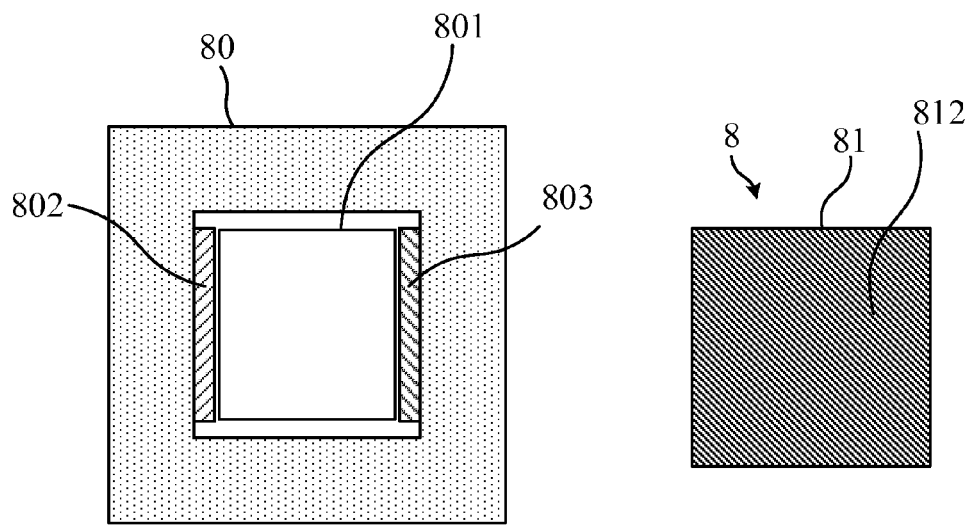
FIG. 9A
FIG. 9B
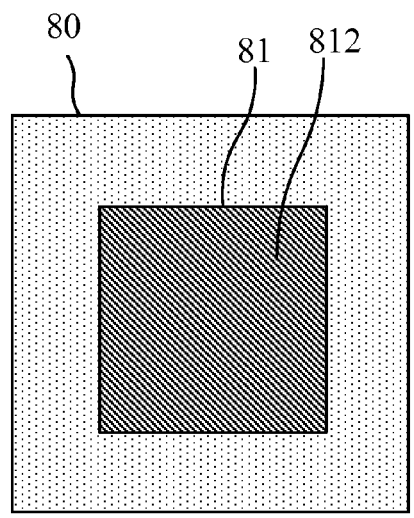
FIG. 9C

METHOD OF MANUFACTURING LED COMPONENT BY INTEGRATING EPITAXIAL STRUCTURE AND PACKAGE SUBSTRATE TOGETHER

PRIORITY CLAIM

This application claims the benefit of the filing date of Taiwan Patent Application No. 102112647, filed Apr. 10, 2013, and U.S. patent application Ser. No. 13/871,793 filed Apr. 26, 2013, entitled "LED COMPONENT BY INTEGRATING EPITAXIAL STRUCTURE AND PACKAGE SUBSTRATE TOGETHER AND METHOD OF MANUFACTURING THE SAME," and the contents of which is hereby incorporated by reference in its entirety.

FIELD OF THE INVENTION

The present invention relates to an LED component by integrating epitaxial structures and a package substrate together and the method of manufacturing the same, and more particularly, to an LED component that the carrier substrate can be used as package substrate directly and the packaging process of LED epitaxial also can be completed on the substrate directly. In actual application, the substrate of the LED component can be mounted and contacted with a heat conductive or dissipation device. The integral LED component is fabricated by wafer level process and cut from the wafer to form an independent component. Different manufacturing processes allow the integral LED component to be made into a Vertical LED structure or a Lateral LED structure.

BACKGROUND OF THE INVENTION

In the LED industry, the manufacturing process of LED chips and the packaging process of LED are independent processes. The LED lighting unit still needs to be cut and tested to form a final chip product no matter what substrate is used in LED epitaxial process. The form of LED chip is usually designed as a rectangular figure due to the consideration of operability in the cutting process despite the LED chip is vertical structure or lateral structure, wire bonding process or flip-chip process. Then, the rectangular LED chip is mounted on a submount by die bonding and welded onto a PCB by method of SMT to form an LED package unit. The LED package unit can also be formed by mounting the chip on a PCB directly (COB method). The package PCB then needs to be mounted and contacted with a heat conductive or a dissipation device to solve the heat dissipation problem, and the heat due to electrical current in the epitaxial structures needs to be dissipated by heat conduction from the substrates to the heat dissipation devices. However, if the electric power or power density is too high, the heat resistance can make the temperature of the LED too high which lowers the life time and optical properties of the LED.

Please refer to FIG. 1, FIG. 1A and FIG. 1B are schematic diagrams illustrating LED chips, LED package and heat dissipation in the prior art. An LED chip 1 is composed of an epitaxial structure 10 and a carrier substrate 11. The LED chip 1 is tested, cut from a wafer, and then packaged to form an LED unit. As shown in FIG. 1A, an LED package unit is formed by mounting the LED chip 1 on a submount 12 with die bonding, wire bonding and phosphor coating processes. In actual application, the LED unit with the submount 12 still needs to be mounted onto a heat conductive PCB, the PCB 13 then is mounted and contacted with a heat dissipation device 14. Another application requirement for high power illumination, as shown in FIG. 1B, an LED package unit is formed by mounting the LED chip 1 on a heat conductive PCB directly (COB, Chip-on-Board). The COB unit is mounted and contacted with a heat dissipation device 14. However, in the prior art of FIG. 1A or FIG. 1B, the manufacturing process for the LED chip 1 and the packaging process of LED are independent processes.

Generally speaking, there are two types of the structures for LED chips, lateral types and vertical types. The lateral type is forming LED epitaxial structures and electrodes on an epitaxial wafer, where the epitaxial wafer needs to go through a thinning process to become a carrier substrate for epitaxial structures and then be cut into LED chips. The vertical type is transferring LED epitaxial structures from an epitaxial wafer to a carrier wafer, where the carrier wafer still needs to go through a thinning process and form electrodes, and then be cut into LED chips. It does not matter whether the LED chip is a lateral type or a vertical type, the LED chips still need an added package substrate to that goes through die bonding, wire bonding and phosphor coating processes to connect an external power and a heat dissipation device. For the demand of high power density, high luminous flux, high working life and low cost, the prior art of FIG. 1A and FIG. 1B still have some limits.

SUMMARY OF THE INVENTION

One objective of the present invention is to provide an LED component by integrating epitaxial structures and a package substrate together and the method of manufacturing the same so as to solve the problem in the prior art.

The integral LED component of the present invention is mounted into a hollow area of a hollow carrier, the hollow carrier has two conductive electrodes with opposite polarities used for connecting to an external power. The integral LED component comprises a substrate, N number of LED epitaxial structures where N is a natural number greater than one, at least one third electrode and at least one fourth electrode. The substrate has an upper surface and a lower surface. The N number of LED epitaxial structures are formed on the upper surface of the substrate, the at least one of the N number of LED epitaxial structures comprises at least one first electrode and at least one second electrode. Further, the polarities of the at least one first electrode and the at least one second electrode are opposite. The at least one third electrode and the at least one fourth electrode are formed on the upper surface and located outside the N number of LED epitaxial structures, the at least one third electrode and the at least one fourth electrode are electrically connected to the at least one first electrode and the at least one second electrode to form a circuit. The polarities of the at least one third electrode and the at least one fourth electrode are opposite. Additionally, the two conductive electrodes of the hollow carrier are used for electrically connecting the at least one third electrode and the at least one fourth electrode of the substrate, and the lower surface of the substrate is exposed to the hollow carrier.

In another embodiment, the present invention provides another LED component by integrating epitaxial structures and a package substrate together. The integral LED component is mounted into a hollow area of a hollow carrier, the hollow carrier has two conductive electrodes with opposite polarities used for connecting to an external power. The integral LED component comprises a substrate, an LED epitaxial structure, at least one third electrode and at least one fourth electrode. The substrate has an upper surface and a lower surface. The LED epitaxial structure is formed on the upper surface of the substrate, the LED epitaxial structure comprises at least one first electrode and at least one second electrode. The polarities of the at least one first electrode and the at least one second electrode are opposite. The at least one third electrode and the at least one fourth electrode are formed on the upper surface and located outside the LED epitaxial structure, the at least one third electrode and the at least one fourth electrode are electrically connected to the at least one first electrode and the at least one second electrode to form a circuit. The polarities of the at least one third electrode and the at least one fourth electrode are opposite. Additionally, the two conductive electrodes of the hollow carrier are used for electrically connecting the at least one third electrode and the at least one fourth electrode of the substrate, and the lower surface of the substrate is exposed to the hollow carrier.

Alternatively, the present invention also provides a method of manufacturing an integral LED component. Because the substrate of the invention is not only a carrier substrate but also a package substrate, and the lower surface of the substrate can be mounted directly onto a heat conductive or a dissipation device, the heat conduction from the epitaxial structures to the lower surface of the substrate is shortest. Due to this reason, the heat resistance (Rjc) in the integral LED component can be dramatically reduced. The structure of this integral LED component can be applied in vertical LED structures and lateral LED structures.

According to the above, the cost of the integral LED component of the present invention can be greatly reduced due to the simplification of the process as well as the reduction of material consumption.

Many other advantages and features of the present invention will be further understood by the following detailed descriptions and the appended drawings.

BRIEF DESCRIPTION OF THE DRAWINGS

FIG. 9A to FIG. 9C are schematic diagrams illustrating an integral LED component, a hollow carrier and a back view of the integral LED component mounted into the hollow carrier.

To facilitate understanding, identical reference numerals have been used, where it is possible to designate identical elements that are common to the figures.

DETAILED DESCRIPTION

The present invention is related to an LED component by integrating epitaxial structures and a package substrate together and the method of manufacturing the same. The present invention can reduce the cost because of simplification of the manufacturing process as well as the reduction of material consumption. Further, the present invention can improve the efficiency of an LED component by the reduction of heat conduction resistance to solve the problem in the prior art.

Figure 1A:
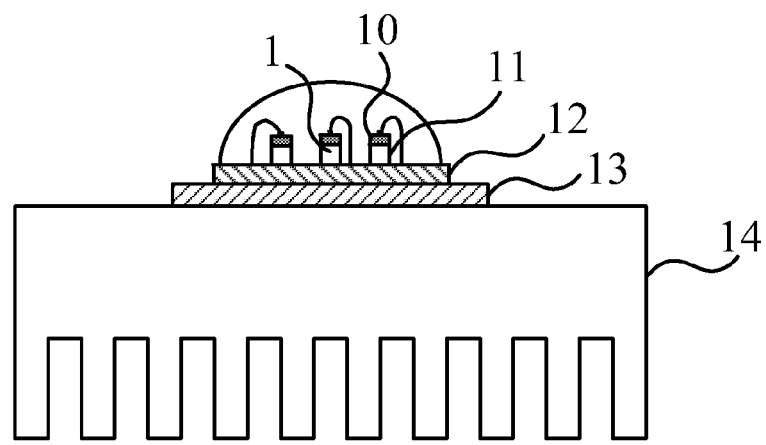
FIG. 1A and FIG. 1B are schematic diagrams illustrating LED chips, LED package and heat dissipation in the prior art.
Figure 1B:
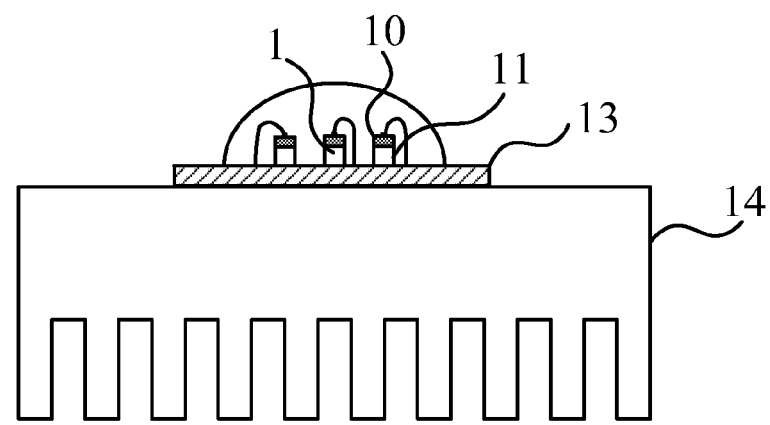
Figure 2A:
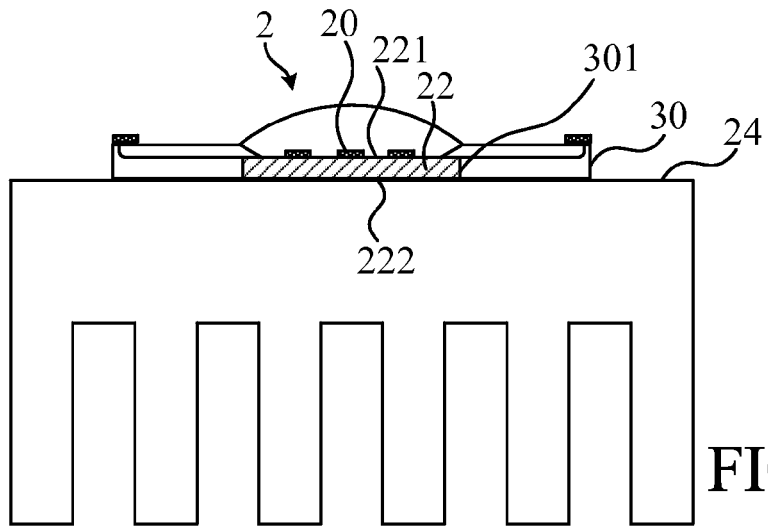
FIG. 2A and FIG. 2B are schematic diagrams illustrating LED epitaxial structures, LED package, a hollow carrier and a heat conductive or dissipation device of an integral LED according to the invention.
Figure 2B:
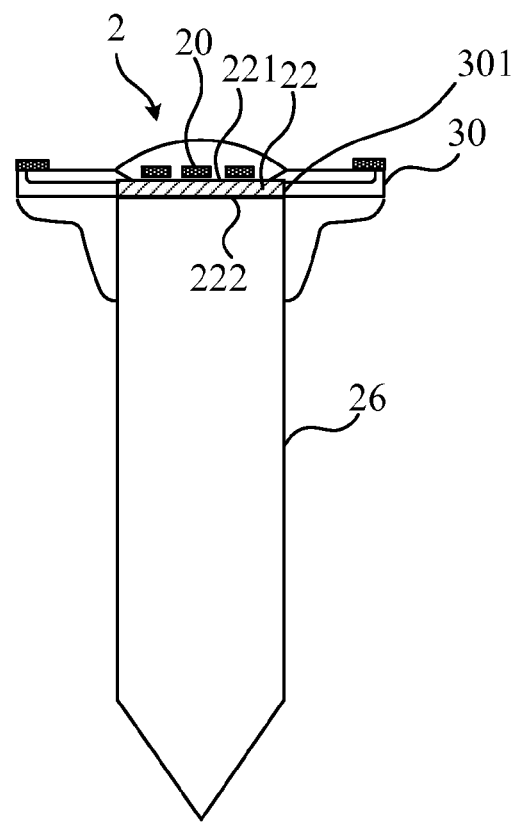

Please refer to FIG. 2A and FIG. 2B, FIG. 2A and FIG. 2B are schematic diagrams illustrating LED epitaxial structures, an LED package, a hollow carrier and a heat conductive or a dissipation device of an integral LED according to the invention. According to an embodiment, an LED component 2 integrates epitaxial structures and a package substrate together that can be mounted into a hollow area 301 of a hollow carrier 30 so that the lower surface 222 of the substrate 22 can be mounted and contacted with a heat conductive or a dissipation device. As shown in FIG. 2A, the LED epitaxial structures are formed on the upper surface 221 of the substrate 22, that is to say, the substrate 22 of the LED component 2 is not only a carrier substrate but also a package substrate, and the lower surface 222 of the substrate 22 can be mounted and contacted with a heat dissipation device 24. As shown in FIG. 2B, the lower surface 222 of the substrate 22 is mounted and contacted with a heat conductive device 26, where the heat conductive device 26 is a flat miniature heat pipe.

Figure 3:
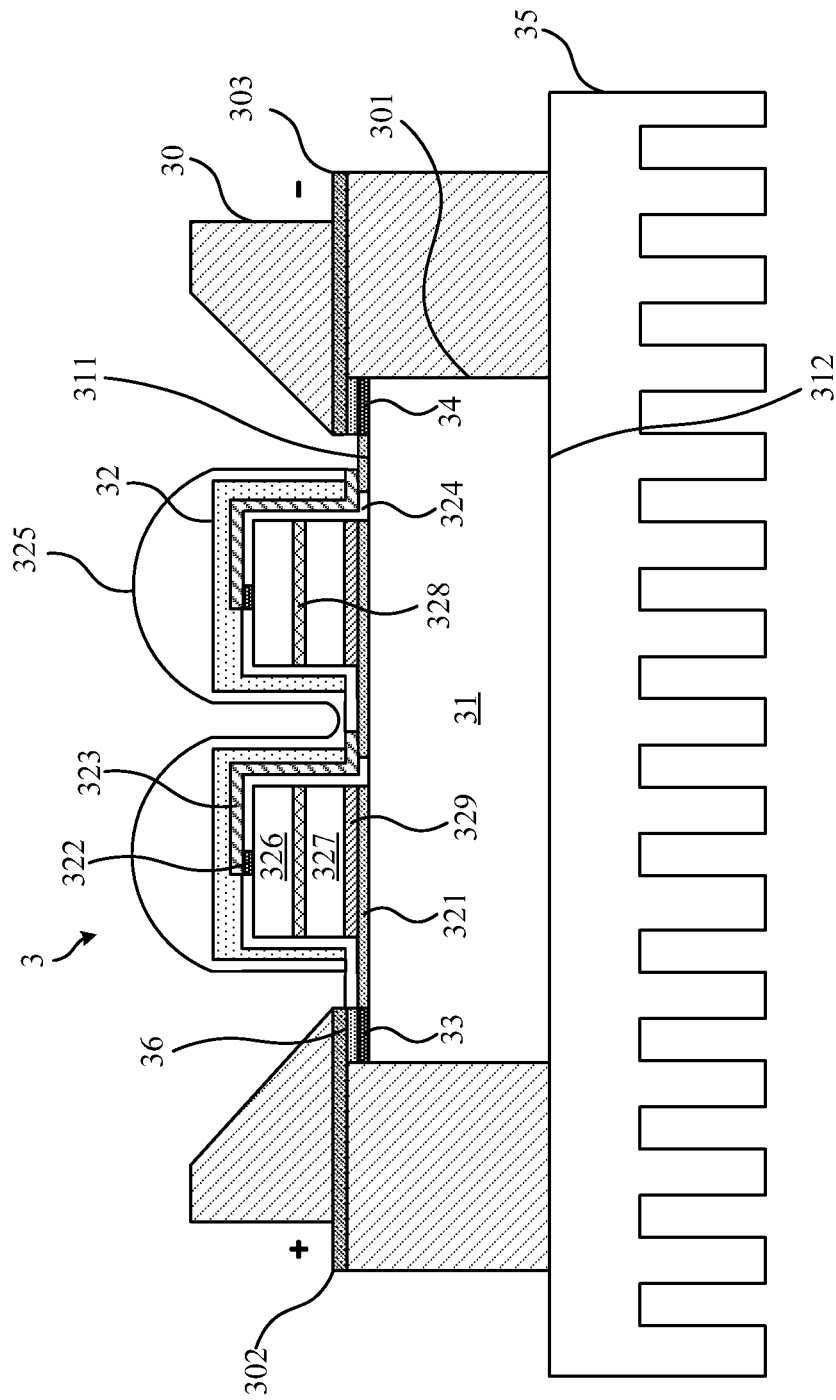
FIG. 3 is a schematic diagram illustrating an integral LED component according to an embodiment of the invention.

To further describe the structures of the present invention, please refer to FIG. 3. FIG. 3 is a schematic diagram illustrating an integral LED component according to an embodiment of the invention. According to an embodiment of FIG. 3, the integral LED component 3 of the present invention is mounted into a hollow area 301 of a hollow carrier 30. The hollow carrier 30 has two conductive electrodes 302, 303 with opposite polarities used for connecting to an external power. The integral LED component comprises a substrate 31, N number of LED epitaxial structures 32 where N is a natural number greater than one, at least one third electrode 33 and at least one fourth electrode 34. The substrate has an upper surface 311 and a lower surface 312. The N number of LED epitaxial structures 32 are formed on the upper surface 311 of the substrate 31, the at least one of the N number of LED epitaxial structures 32 comprises at least one first electrode 321 and at least one second electrode 322. Further, the polarities of the at least one first electrode 321 and the at least one second electrode 322 are opposite. The at least one third electrode 33 and the at least one fourth electrode 34 are formed on the upper surface 311 and located outside the N number of LED epitaxial structures 32, the at least one third electrode 33 and the at least one fourth electrode 34 are electrically connected to the at least one first electrode 321 and the at least one second electrode 322 to form a circuit. The polarities of the at least one third electrode 33 and the at least one fourth electrode 34 are opposite. Additionally, the two conductive electrodes 302, 303 of the hollow carrier 30 are used for electrically connecting the at least one third electrode 33 and the at least one fourth electrode 34 of the substrate 31;

and meanwhile, the lower surface 311 of the substrate 31 is exposed to the hollow carrier 30.

In this embodiment, the at least one first electrode 321 is connected with the at least one third electrode 33, outside the N number of LED epitaxial structures 32 is a lens 325, and each LED epitaxial structures 32 comprises a n-type semiconductor layer 326, a p-type semiconductor layer 327, a MQW layer 328 and a light-reflective layer 329. The n-type semiconductor layer 326 is coated with a dielectric layer 324, where the dielectric layer 324 is coated with a conductor material layer 323 for electrically connecting the at least one first electrode 321 and the at least one second electrode 322. Additionally, the two conductive electrodes 302, 303 of the hollow carrier 30 are electrically connected with the at least one third electrode 33 and the at least one fourth electrode 34 of the substrate 31 of the integral LED component 3 by a solderable metal 36 so that the at least one third electrode 33 and the at least one fourth electrode 34 can be electrically connected with the at least one first electrode 321 and the at least one second electrode 322 of the N number of LED epitaxial structures 32 to form a circuit. However, the present invention is not limited to the above method, the at least one first electrode 321 and the at least one third electrode 33 can be made integral too.

Furthermore, the lower surface 312 of the substrate 31 of the integral LED component 3 is mounted and contacted with a heat dissipation device 35. The substrate 31 is chosen from silicon, germanium, SiC, GaN, GaAs, sapphire or metal with dielectric layer. In another embodiment, the substrate 31 can also be made from copper, other metals, or other alloy substrates, and the lower surface of the substrate 31 has a dielectric layer formed thereon. In addition, the substrate 31 is formed either by chemical deposition or physical deposition processes.

Figure 4A:
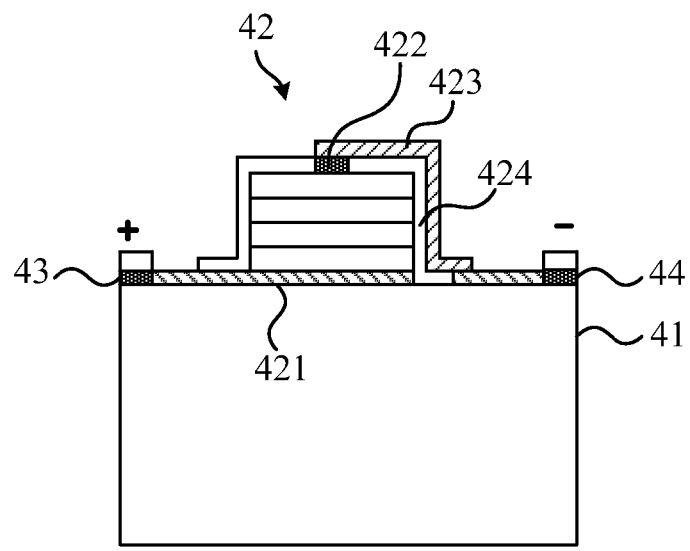
FIG. 4A is a schematic diagram illustrating vertical LED epitaxial structures according to an embodiment of the invention.
Figure 4B:
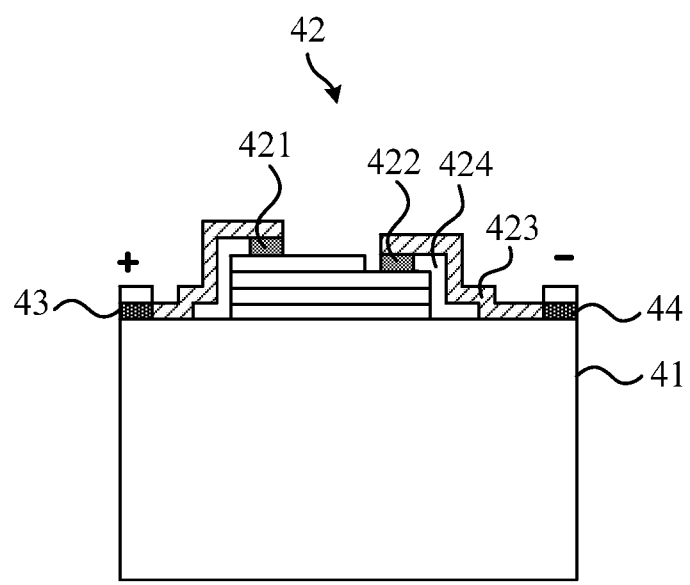
FIG. 4B is a schematic diagram illustrating lateral LED epitaxial structures according to an embodiment of the invention.

Please refer to FIG. 4A and FIG. 4B. FIG. 4A is a schematic diagram illustrating vertical LED epitaxial structures according to an embodiment of the invention and FIG. 4B is a schematic diagram illustrating lateral LED epitaxial structures according to an embodiment of the invention. In the integral LED component of the present invention, the N number of LED epitaxial structures 42 can be either vertical structures (FIG. 4A) or lateral structures (FIG. 4B). If the LED epitaxial structures 42 are vertical structures, the at least one first electrode 421 of the LED epitaxial structures 42 is a bonding metal layer, and the LED epitaxial structures 42 are transferred from another epitaxial substrate onto the substrate 41. If the LED epitaxial structures 42 are lateral structures, the LED epitaxial structures 42 are grown directly on the substrate 41 by an epitaxial process. In an example of the vertical structures (FIG. 4A), the LED epitaxial structures 42 comprises at least one first electrode 421 and at least one second electrode 422, the polarities of the at least one first electrode 421 and the at least one second electrode 422 are opposite, moreover, at least one third electrode 43 and at least one fourth electrode 44 are formed on the upper surface of the substrate 41 and located outside the LED epitaxial structures 42. The LED epitaxial structures 42 comprises a dielectric layer 424, the dielectric layer 424 is coated with a conductor material layer 423 for electrically connecting the at least one second electrode 422 and the at least one fourth electrode 44. In an example of the lateral structures (FIG. 4B), the at least one third electrode 43 and the at least one fourth electrode 44 are electrically connected to the at least one first electrode 421 and the at least one second electrode 422 to form a circuit through the conductor material layer 423. The polarities of the at least one third electrode 43 and the at least one fourth electrode 44 are opposite.

Figure 5A:
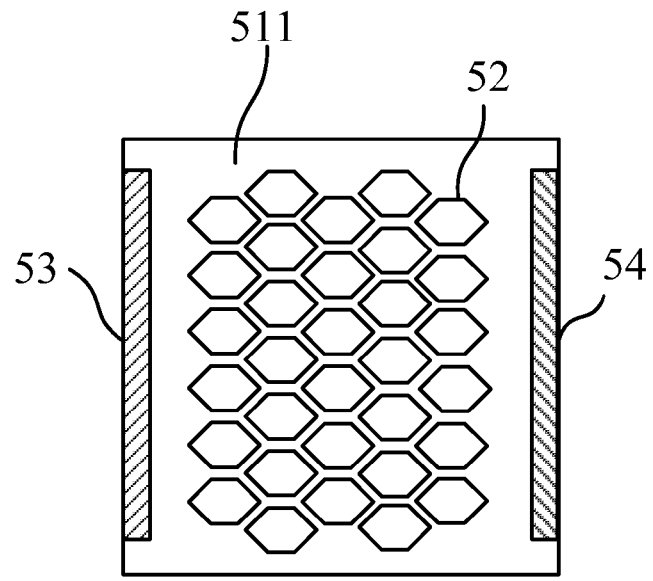
FIG. 5A and FIG. 5B are schematic diagrams illustrating a upper surface of LED epitaxial structures according to an embodiment of the invention.
Figure 5B:
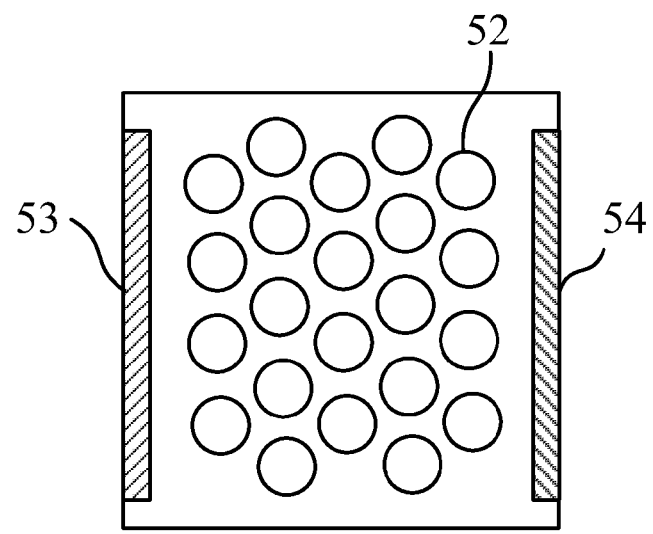

In this embodiment, each LED epitaxial structure of the present invention can be composed of a plurality of epitaxial substructures which have positive and negative electrodes. FIG. 5A and FIG. 5B are schematic diagrams illustrating an upper surface of LED epitaxial structures according to an embodiment of the invention. As shown in FIG. 5A and FIG. 5B, the shape of the upper surface of the N number of LED epitaxial structures 52 can be hexagonal or circular. There is an optical lens structure disposed above each N number of LED epitaxial structures. The at least one third electrode 53 and the at least one fourth electrode 54 are formed on the upper surface 511 and are located outside the N number of LED epitaxial structures 52. However, the present invention is not limited to this, the shape of the upper surface of the N number of LED epitaxial structures 52 can be designed with other geometric shapes or mixtures with various shapes for improving the luminous efficiency.

Figure 6:
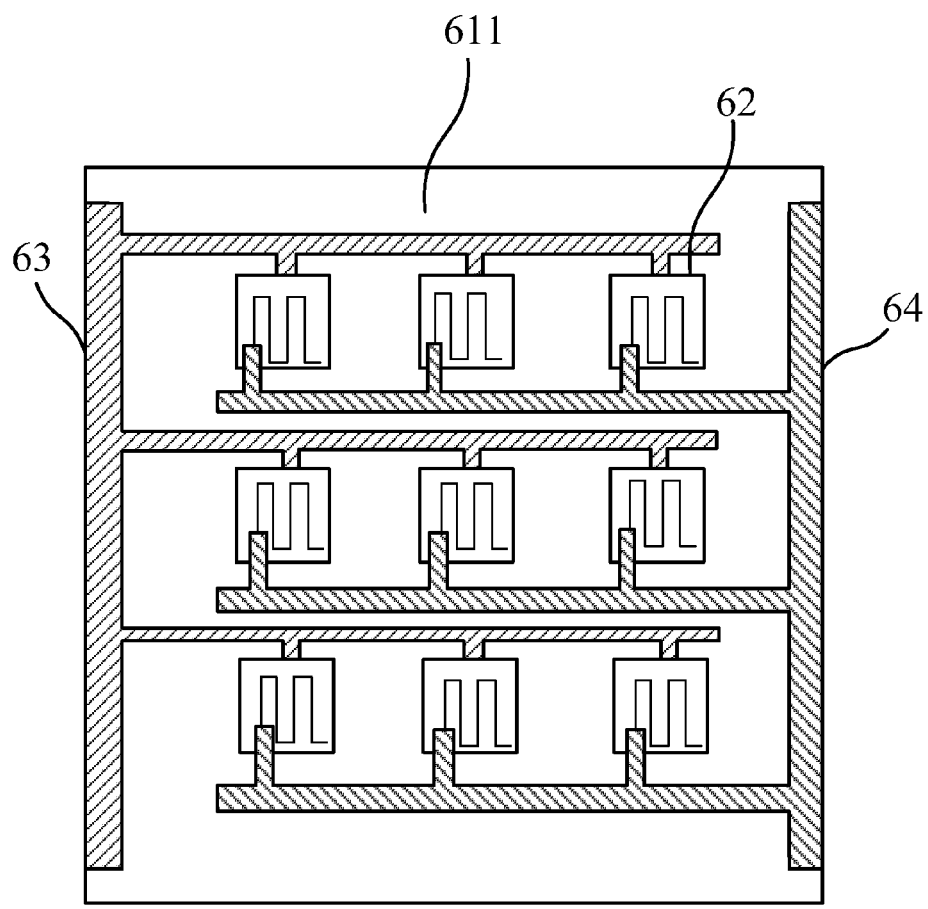
FIG. 6 is a top view diagram illustrating epitaxial structures and parallel connected electrodes of a vertical LED according to an embodiment of the invention.

Please refer to FIG. 6. FIG. 6 is a top view diagram illustrating epitaxial structures and parallel connected electrodes of a vertical LED according to an embodiment of the invention. In this embodiment, the at least one first electrode of the N number of LED epitaxial structures 62 is electrically connected with the at least one third electrode 63 of the upper surface 611, and the at least one second electrode of the N number of LED epitaxial structures 62 is electrically connected with the at least one fourth electrode 64 of the upper surface 611, so as to form a parallel circuit. The parallel circuit formed in the N number of LED epitaxial structures can be put into the integral LED component for current sharing to reduce the current through each epitaxial structure. However, the present invention is not limited to the above method. In another embodiment, the at least one first electrode and the at least one third electrode are positive electrodes, and the at least one second electrode and the at least one fourth electrode are negative electrodes. The N number of LED epitaxial structures are connected in series so as to electrically connect the at least one first electrode and the at least one second electrode as well as the at least one third electrode and the at least one fourth electrode of the upper surface to form a series circuit. Furthermore, in the integral LED component of the present invention, the N number of LED epitaxial structures can be divided into M number of structure groups, where M is a natural number greater than one. The LED epitaxial structures in each structure group are connected with each other in series to electrically connect the at least one first electrode and the at least one second electrode, and the M number of structure groups are connected in parallel to electrically connect the at least one third electrode and the at least one fourth electrode of the upper surface, to further form a combined series and parallel circuit.

Please refer to FIG. 3 again. According to another embodiment of the present invention, the at least one first electrode 321, the at least one second electrode 322, the at least one third electrode 33 and the at least one fourth electrode 34 are connected through the conductor material 323 formed on the dielectric layer 324. In addition, the at least one third electrode 33 and the at least one fourth electrode 34 on the upper surface 311 of the substrate 31 can be used as probe electrodes in the measurement of the integral LED component 3. When the at least one third electrode 33 and the at least one fourth electrode 34 are connected with the external power, the upper surface 311 and the lower surface 312 of the substrate 31 are in an electrically insulated state.

Figure 7:
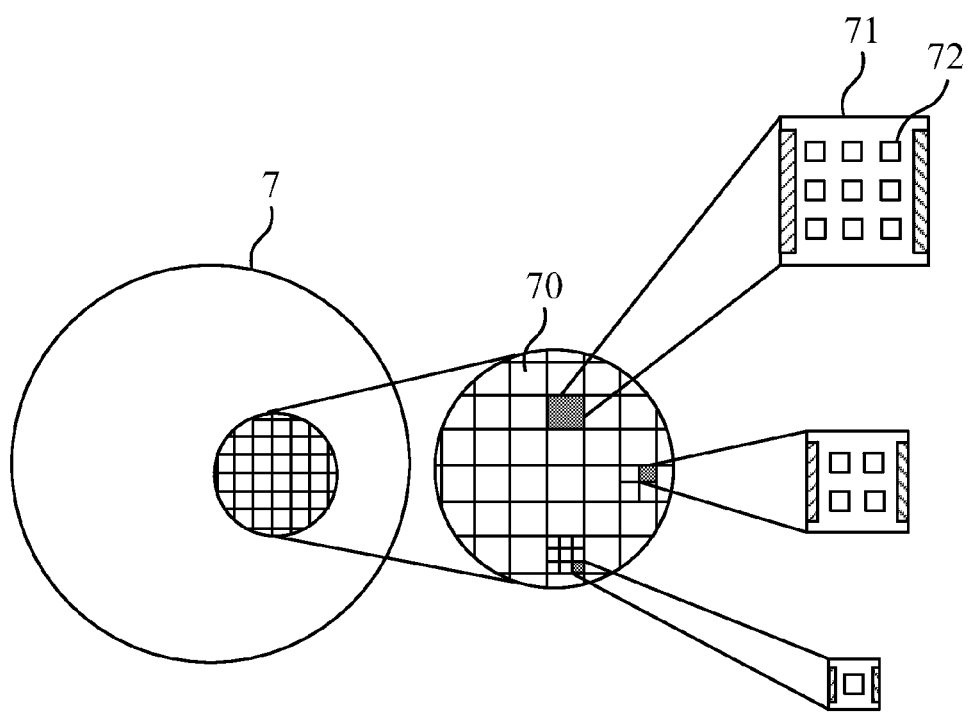
FIG. 7 is a schematic diagram illustrating different-sized integral LED components on a wafer according to an embodiment of the invention.

Please refer to FIG. 7. FIG. 7 is a schematic diagram illustrating different-sized integral LED components on a wafer according to an embodiment of the invention. As shown in FIG. 7, the integral LED component 70 of the present invention can be cut into various sizes from a wafer 7, thus, the number of LED epitaxial structures 72 on the substrate 71 changes with different designs.

Figure 8A:
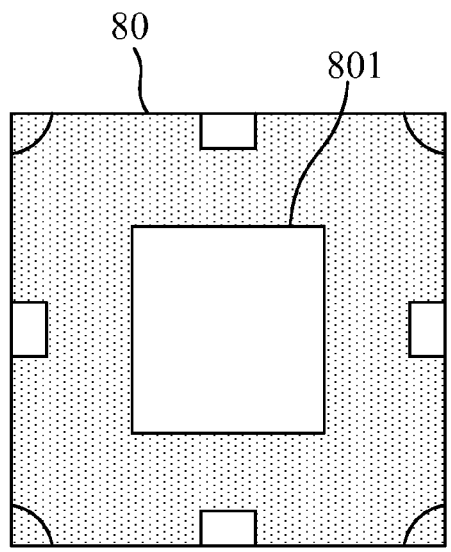
FIG. 8A to FIG. 8C are schematic diagrams illustrating an integral LED component, a hollow carrier and a front view of the integral LED component mounted into the hollow carrier.
Figure 8B:
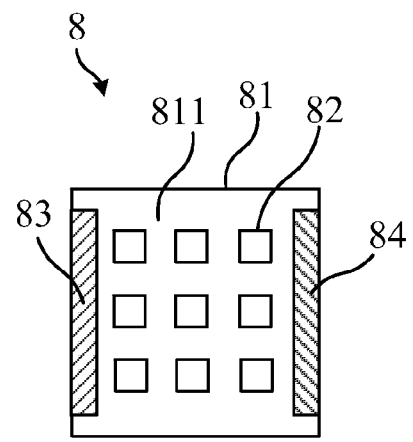
Figure 8C:
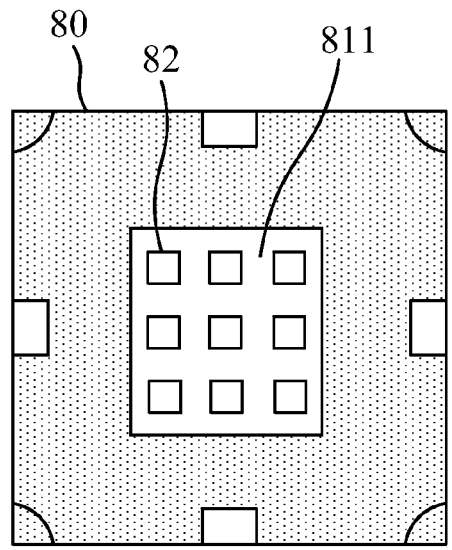

Please refer to FIG. 8A to FIG. 8C and FIG. 9A to FIG. 9C together. FIG. 8A to FIG. 8C are schematic diagrams illustrating an integral LED component, a hollow carrier and a front view of the integral LED component mounted into the hollow carrier; FIG. 9A to FIG. 9C are schematic diagrams illustrating an integral LED component, a hollow carrier and a back view of the integral LED component mounted into the hollow carrier. In this embodiment, the upper surface 811 of the integral LED component 8 comprises N number of LED epitaxial structures 82, the integral LED component 8 is mounted into the hollow area 801 of the hollow carrier 80 to expose the lower surface 812 of the substrate 81. The hollow carrier 80 has two conductive electrodes 802, 803 with opposite polarities used for connecting to an external power. When the integral LED component 8 is mounted into the hollow area 801 of the hollow carrier 80, the two conductive electrodes 802, 803 of the hollow carrier 80 are electrically connected with the at least one third electrode 83 and the at least one fourth electrode 84 of the substrate 81. In particular, a lower surface of the hollow carrier 80 is coplanar with the lower surface 812 of the substrate 81. The hollow carrier 80 is a precast chip carrier or a printed circuit board. The substrate 81 is supported by the hollow carrier 80 so that the lower surface 812 of the substrate 81 can be flatly mounted and contacted with a heat conductive or dissipation device.

According to another embodiment of the present invention, the integral LED component can be a DC-LED component or an AC-LED component. The substrate can further comprise an antistatic component, a control element, or a sensing element. Further, the N number of LED epitaxial structures can be laser diode epitaxial structures and the integral LED component can be an integral laser diode component. The N number of LED epitaxial structures can also be the epitaxial structures of a concentrator solar cell and the integral LED component can be an integral concentrator solar cell.

In actual application, the integral LED component of the present invention is made with multiple epitaxial structures, that is to say, there are a plurality of epitaxial substructures on the substrate. Under unit input power, a plurality of miniature epitaxial substructures per unit area can reduce the current through each epitaxial structure by a parallel circuit or a combined series and parallel circuit so as to improve the luminous efficiency.

In another embodiment of the present invention, the upper surface of the integral LED component comprises a single large epitaxial structure, at least one third electrode and at least one fourth electrode. The at least one third electrode and the at least one fourth electrode are formed on the upper surface and located outside the LED epitaxial structures. The LED epitaxial structure comprises at least one first electrode and at least one second electrode, the polarities of the at least one first electrode and the at least one second electrode are opposite. The at least one first electrode of the LED epitaxial structures is electrically connected with the at least one third electrode of the upper surface, and the at least one second electrode of the LED epitaxial structures is electrically connected with the at least one fourth electrode of the upper surface to form a circuit. This embodiment is a simplified version of the integral LED component of the present invention, a choice for low powered applications.

Figure 10:
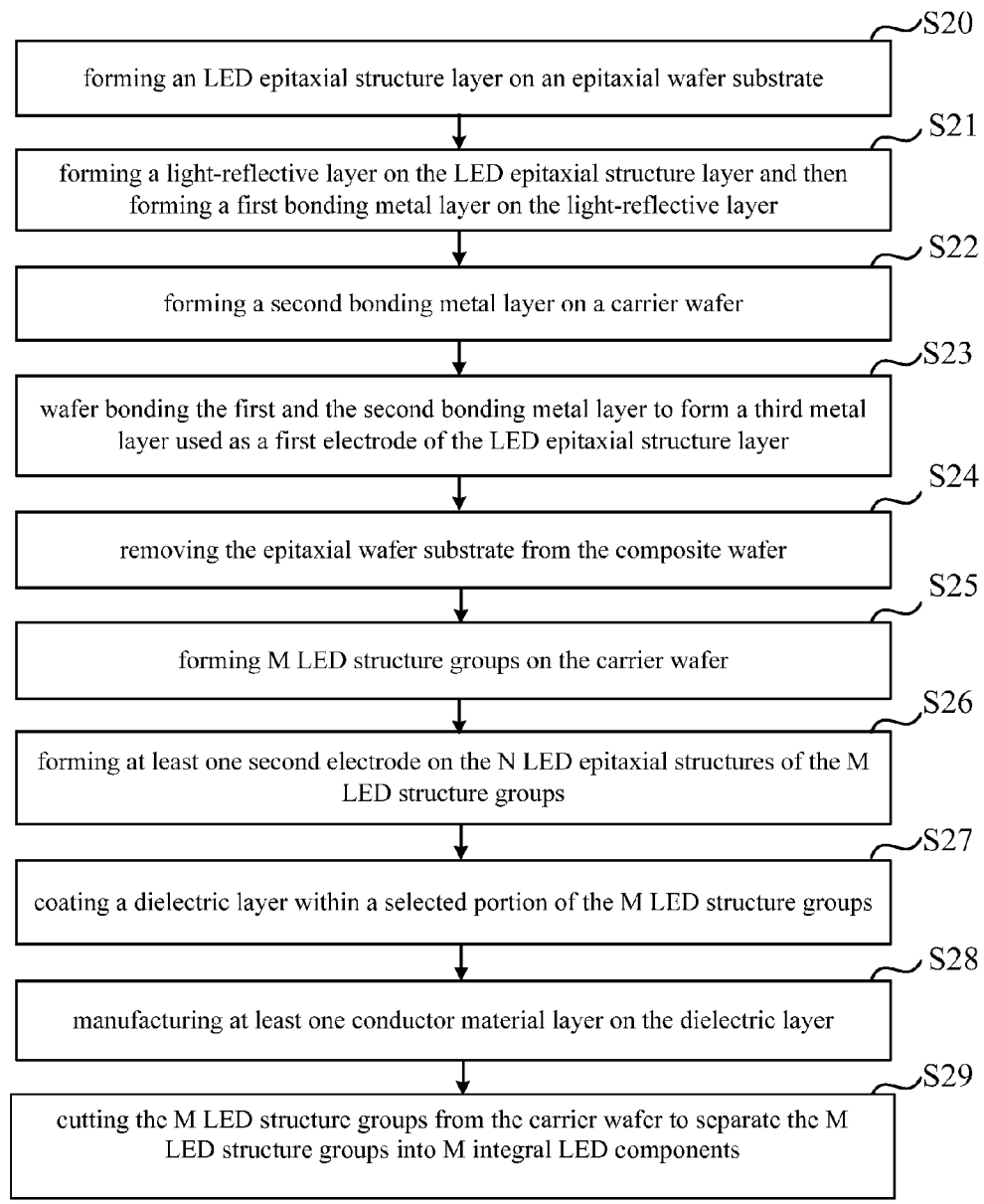
FIG. 10 is a flow chart illustrating a method of manufacturing a vertical integral LED component according to an embodiment of the invention.

The present invention also provides a method of manufacturing an integral LED component to solve the problem in the prior art. Please refer to FIG. 10. FIG. 10 is a flow chart illustrating a method of manufacturing a vertical integral LED component according to an embodiment of the invention. The method comprises the following steps of: step S20: forming an LED epitaxial structure layer on an epitaxial wafer substrate; step S21: forming a light-reflective layer on the LED epitaxial structure layer and then forming a first bonding metal layer on the light-reflective layer; step S22: forming a second bonding metal layer on a carrier wafer; step S23: wafer bonding the first and the second bonding metal layer to form a third metal layer used as a first electrode of the LED epitaxial structure layer, so as to manufacture a composite wafer having the LED epitaxial structure layer; step S24: removing the epitaxial wafer substrate from the composite wafer, so that the third metal layer, the light-reflective layer and the LED epitaxial structure layer can be formed on the carrier wafer; step S25: forming M number of LED structure groups on the carrier wafer, wherein the M number of LED structure groups comprise N number of LED epitaxial structures, at least one third electrode and at least one fourth electrode where M and N are natural numbers greater than one, the at least one third and fourth electrode are located outside the N number of LED epitaxial structures and have opposite polarities; step S26: forming at least one second electrode on the N number of LED epitaxial structures of the M number of LED structure groups; step S27: coating a dielectric layer within a selected portion of the M number of LED structure groups; step S28: manufacturing at least one conductor material layer on the dielectric layer for electrically connecting the at least one first electrode, the at least one second electrode, the at least one third electrode, and the at least one fourth electrode with each other, so as to form a circuit; and step S29: cutting the M number of LED structure groups from the carrier wafer to separate the M LED structure groups into M number of integral LED components. The integral LED component formed by this method is a vertical integral LED component where the N number of LED epitaxial structures are transferred from another epitaxial substrate onto the upper surface of the substrate.

In this embodiment, the method of manufacturing an integral LED component further comprises the following steps of: providing a solderable metal on the at least one third electrode and the at least one fourth electrode as a electrode for connecting with an external power; providing a phosphor material layer on the surface of the N number of LED epitaxial structures for transferring a blue light or a UV light into a white light; providing a transparent protective layer on the M number of integral LED components for protecting the integral LED components; providing an optical lens above each N number of LED epitaxial structure for regulating the light emitted by each epitaxial structure to improve the luminous efficiency of the integral LED component. When the M number of integral LED components are tested and cut from a wafer, each of the integral LED components are mounted into a hollow carrier that has at least two external electrodes with opposite polarities and at least two internal electrodes with opposite polarities. The external electrodes are electrically connected with the internal electrodes by the same polarity. The at least two external electrodes are for connecting to an external power, and the at least two internal electrodes are for connecting the at least one third electrode and the at least one fourth electrode. The integral LED component is combined with the hollow carrier having a circuit structure to form a complete LED component for end customers. The function of the hollow carrier is not only providing electrodes for connecting external power but being a carrier that supports the substrate of the integral LED component so that the substrate can be flatly mounted and contacted with a heat conductive or a dissipation device.

Figure 11:
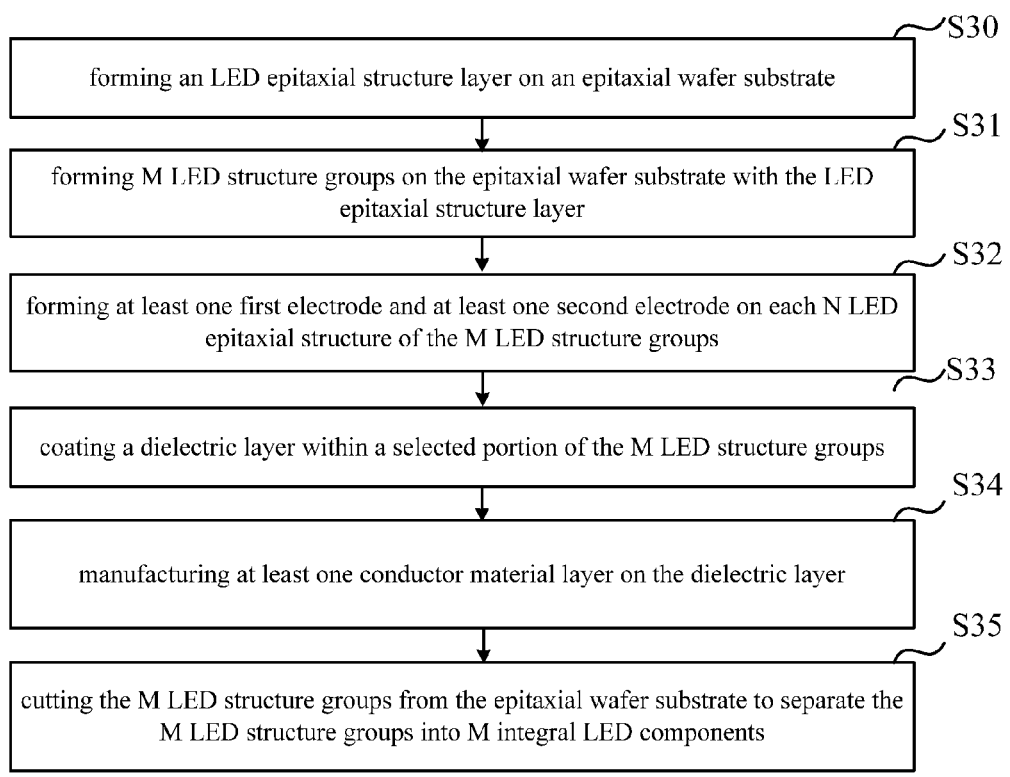
FIG. 11 is a flow chart illustrating a method of manufacturing a lateral integral LED component according to an embodiment of the invention.

Furthermore, the present invention provides another method of manufacturing an integral LED component. Please refer to FIG. 11. FIG. 11 is a flow chart illustrating a method of manufacturing a lateral integral LED component according to an embodiment of the invention. The method comprises the following steps of: step S30: forming an LED epitaxial structure layer on an epitaxial wafer substrate; step S31: forming M number of LED structure groups on the epitaxial wafer substrate with the LED epitaxial structure layer, wherein the M number of LED structure groups comprise N number of LED epitaxial structures, at least one third electrode and at least one fourth electrode, where M and N are natural numbers greater than one, and the at least one third and fourth electrode are located outside the N number of LED epitaxial structures with opposite polarities; step S32: forming at least one first electrode and at least one second electrode on each N number of LED epitaxial structure of the M number of LED structure groups, wherein the polarities of the at least one first electrode and the at least one second electrode are opposite; step S33: coating a dielectric layer within a selected portion of the M number of LED structure groups; step S34: manufacturing at least one conductor material layer on the dielectric layer for electrically connecting the at least one first electrode, the at least one second electrode, the at least one third electrode, and the at least one fourth electrode with each other, so as to form a circuit; and step S35: cutting the M number of LED structure groups from the epitaxial wafer substrate to separate the M number of LED structure groups into M number of integral LED components. The integral LED component formed by this method is a lateral integral LED component where the N number of LED epitaxial structures are formed on an epitaxial substrate directly.

In this embodiment, the method of manufacturing an integral LED component further comprises the following steps of: providing a solderable metal on the at least one third electrode and the at least one fourth electrode; providing a phosphor material layer on the surface of the N number of LED epitaxial structures; providing a transparent protective layer on the M number of integral LED components; and providing an optical lens above each N number of LED epitaxial structure. The integral LED components is then mounted into a hollow carrier where the hollow carrier has at least two external electrodes with opposite polarities and at least two internal electrodes with opposite polarities. The external electrodes are electrically connected with the internal electrodes by the same polarity. The at least two external electrodes are for connecting an external power and the at least two internal electrodes are for connecting the at least one third electrode and the at least one fourth electrode.

According to the above, the cost of the integral LED component of the present invention can be greatly reduced due to the simplification of the manufacturing process as well as the reduction of material consumption. In addition, because the substrate of the invention is not only a carrier substrate but also a package substrate, and the lower surface of the substrate can be mounted directly onto a heat conductive or a dissipation device, the heat conduction distance from the epitaxial structures to the lower surface of the substrate is shortest. Because of this, the heat resistance (Rjc) in the integral LED component can be dramatically reduced. The structure of this integral LED component can be applied in vertical LED structures and lateral LED structures. In summary, the present invention, an LED component by integrating epitaxial structures and a package substrate together and the method of manufacturing the same, is a versatile technology platform for developing high power LED components with reduced costs.

With the example and explanations above, the features and spirits of the invention hopefully were well described. More importantly, the present invention is not limited only to the embodiments described here. Those skilled in the art will readily observe that numerous modifications and alterations of the device may be made while retaining the concept of the invention. Accordingly, the above disclosure should be construed as limited only by the metes and bounds of the appended claims.

The invention claimed is:

1. A method of manufacturing an integral LED component, comprising the following steps of:
    forming an LED epitaxial structure layer on an epitaxial wafer substrate;
    forming a light-reflective layer on the LED epitaxial structure layer and then forming a first bonding metal layer on the light-reflective layer;
    forming a second bonding metal layer on a carrier wafer;
    wafer bonding the first and the second bonding metal layer to form a third metal layer used as a first electrode of the LED epitaxial structure layer, so as to manufacture a composite wafer having the LED epitaxial structure layer;
    removing the epitaxial wafer substrate from the composite wafer, so that the third metal layer, the light-reflective layer and the LED epitaxial structure layer can be formed on the carrier wafer;
    forming M number of LED structure groups on the carrier wafer, wherein the M number of LED structure groups comprise N number of LED epitaxial structures, at least one third electrode and at least one fourth electrode, M and N are natural numbers greater than one, the at least one third and fourth electrode are located outside the N number of LED epitaxial structures and have opposite polarities;
    forming at least one second electrode on the N number of LED epitaxial structures of the M number of LED structure groups;
    coating a dielectric layer within a selected portion of the M number of LED structure groups;
    manufacturing at least one conductor material layer on the dielectric layer for electrically connecting the at least one first electrode, the at least one second electrode, the at least one third electrode, and the at least one fourth electrode with each other, so as to form a circuit; and
    cutting the M number of LED structure groups from the carrier wafer to separate the M LED structure groups into M number of integral LED components.

2. The method of manufacturing an integral LED component of claim 1, further comprising the step of:
    providing a solderable metal on the at least one third electrode and the at least one fourth electrode.

3. The method of manufacturing an integral LED component of claim 1, further comprising the step of:
    providing a phosphor material layer on the surface of the N number of LED epitaxial structures.

4. The method of manufacturing an integral LED component of claim 1, further comprising the step of:
    providing a transparent protective layer on the M number of integral LED components.

5. The method of manufacturing an integral LED component of claim 1, further comprising the step of:
    providing an optical lens above each N number of LED epitaxial structure.

6. The method of manufacturing an integral LED component of claim 1, further comprising the step of:

embedding the integral LED component within a hollow area of a hollow carrier, wherein the hollow carrier has two conductive electrodes with opposite polarities used for connecting to an external power, and the two conductive electrodes of the hollow carrier are used for electrically connecting the at least one third electrode and the at least one fourth electrode, and the lower surface of the substrate of the integral LED component is exposed to the hollow carrier.

* * * * *